US011929236B2

(12) United States Patent
Shao et al.

(10) Patent No.: US 11,929,236 B2
(45) Date of Patent: Mar. 12, 2024

(54) METHODS OF TUNING TO IMPROVE PLASMA STABILITY

(71) Applicant: Applied Materials, Inc., Santa Clara, CA (US)

(72) Inventors: Shouqian Shao, Fremont, CA (US); Jianhua Zhou, Campbell, CA (US); Tae Kyung Won, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 150 days.

(21) Appl. No.: 17/630,878

(22) PCT Filed: Aug. 28, 2019

(86) PCT No.: PCT/US2019/048619
§ 371 (c)(1),
(2) Date: Jan. 27, 2022

(87) PCT Pub. No.: WO2021/040707
PCT Pub. Date: Mar. 4, 2021

(65) Prior Publication Data
US 2022/0270858 A1 Aug. 25, 2022

(51) Int. Cl.
*H01J 37/32* (2006.01)
*C23C 16/505* (2006.01)

(52) U.S. Cl.
CPC ...... *H01J 37/32183* (2013.01); *C23C 16/505* (2013.01); *H01J 2237/327* (2013.01)

(58) Field of Classification Search
CPC ........... H01J 37/32183; H01J 37/32091; H01J 37/32165; H01J 37/32174;
(Continued)

(56) References Cited

U.S. PATENT DOCUMENTS

2007/0257743 A1  11/2007  Shannon
2009/0315596 A1  12/2009  Leming et al.
(Continued)

FOREIGN PATENT DOCUMENTS

JP    2003-529216 A    9/2003
JP    2011-181959 A    9/2011
(Continued)

OTHER PUBLICATIONS

International Search Report dated May 27, 2020 for Application No. PCT/US2019/048619.
(Continued)

*Primary Examiner* — Monica C King
(74) *Attorney, Agent, or Firm* — Patterson & Sheridan LLP

(57) ABSTRACT

Embodiments described herein relate to methods of tuning within semiconductor processes to improve plasma stability. In these embodiments, multiple matching networks are provided. Each of the matching networks couple a radio frequency (RF) source to one of multiple connection points located on an electrode. Based on tuning parameter information and physical geometry information, a controller determines a tuning sequence for the multiple matching networks. As such, some of the matching networks are tuned while the other matching networks are locked. Using multiple matching networks leads to a more uniform plasma within the process volume of the process chamber. Improved plasma uniformity leads to less substrate defects and better device performance. Additionally, in these embodiments, the ability to tune each of the matching networks in a sequence decreases or prevents interference from occurring between the matching networks.

20 Claims, 5 Drawing Sheets

(58) Field of Classification Search
CPC ............... H01J 37/32082; H01J 37/321; H01J 37/32449; H01J 37/32568; H01J 37/32715; H01J 37/32834; H01J 37/3299; H01J 2237/3321; H01J 2237/334; H01J 37/32706; H01J 2237/327; H01J 2237/3341; H01J 2237/3343; H01J 37/3244; H01J 37/32577; H01J 37/32816; H01J 37/32899; H01J 37/32926; C23C 16/45565; C23C 16/505
See application file for complete search history.

(56) References Cited

U.S. PATENT DOCUMENTS

| | | |
|---|---|---|
| 2013/0203261 A1 | 8/2013 | Zhao et al. |
| 2014/0152189 A1 | 6/2014 | Gilmore |
| 2017/0314132 A1 | 11/2017 | Kim et al. |

FOREIGN PATENT DOCUMENTS

| | | |
|---|---|---|
| JP | 2016-149366 A | 8/2016 |
| WO | 02-14810 A2 | 2/2002 |

OTHER PUBLICATIONS

Japanese Office Action for JP Application No. 2022-511251 dated Mar. 7, 2023.

METHODS OF TUNING TO IMPROVE PLASMA STABILITY

BACKGROUND

Field

Embodiments described herein generally relate to methods of tuning within semiconductor processes and, more particularly, to methods of tuning within semiconductor processes to improve plasma stability.

Description of the Related Art

Plasma chambers commonly are used to perform processes for fabricating electronic devices such as semiconductors, displays, and solar cells. Such plasma fabrication processes include plasma enhanced chemical vapor deposition (PECVD) of semiconductor, conductor, or dielectric layers on the surface of a substrate or etching of selected portions of such layers on the substrate surface. It is critical for a plasma fabrication process to be performed with high spatial uniformity over the surface of the substrate. A deposition process should be performed so that the deposited material has uniform thickness and quality at all positions on the surface of the substrate. Likewise, etch processes should etch material at a uniform rate at all such positions.

In conventional radio frequency (RF) plasma processing, such as that used during stages of fabrication of many semiconductor devices, RF energy is provided to a substrate process chamber via an RF energy source. Due to mismatches between the impedance of the RF energy source and the plasma formed in the process chamber, RF energy is reflected back to the RF energy source, resulting in inefficient use of the RF energy and wasting energy, causing potential damage to the process chamber or RF energy source, and potential inconsistency/non-repeatability issues with respect to substrate processing. As such, the RF energy is often coupled to the plasma in the process chamber through a fixed or tunable matching network that operates to minimize the reflected RF energy by more closely matching the impedance of the plasma to the impedance of the RF energy source.

Matching networks try and ensure that the output of the RF source is efficiently coupled to the plasma to maximize the amount of energy coupled to the plasma (e.g., referred to as "tuning"). However, in conventional processes, only one RF matching network is often used. When using one RF matching network, especially for a large substrate chamber such for display and solar application, plasma non-uniformity is often an issue. Processes attempting to use multiple RF matching networks with multiple feeds often lead to the plasma stability problem, as interference often occurs between the matching networks. Current approaches such as phase control do not address all the interference issues, and often result in poor results when tuning.

Accordingly, there is a need in the art for methods of tuning within semiconductor processes to improve plasma stability.

SUMMARY

One or more embodiments described herein generally relate to methods of tuning within semiconductor processes to improve plasma stability.

In one embodiment, a method of tuning during a plasma process includes receiving, by a controller, tuning parameter information from each matching network of multiple matching networks, wherein each matching network of the multiple matching networks couples a radio frequency (RF) power source to one of multiple connection points of an electrode; determining a tuning sequence for the multiple matching networks based on the tuning parameter information received by the controller; and tuning one of the multiple matching networks while simultaneously locking each remaining matching networks of the multiple matching networks.

In another embodiment, a method of tuning during a plasma process includes receiving, by a controller, physical geometry information from multiple matching networks, wherein each matching network of the multiple matching networks couples a radio frequency (RF) power source to one of multiple connection points of an electrode; determining a tuning sequence for the multiple matching networks based on the physical geometry information received by the controller; and tuning a pair of the multiple matching networks together while simultaneously locking each remaining matching networks of the multiple matching networks.

In another embodiment, a method of tuning during a plasma process includes receiving, by a controller, tuning parameter information and physical geometry information from each matching network of multiple matching networks, wherein each matching network of the multiple matching networks couples a radio frequency (RF) power source to one of multiple connection points of an electrode; determining a tuning sequence for the multiple matching networks based on the physical geometry information and the tuning parameter information received by the controller; and tuning a pair of the multiple matching networks together while simultaneously locking each remaining matching networks of the multiple matching networks.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
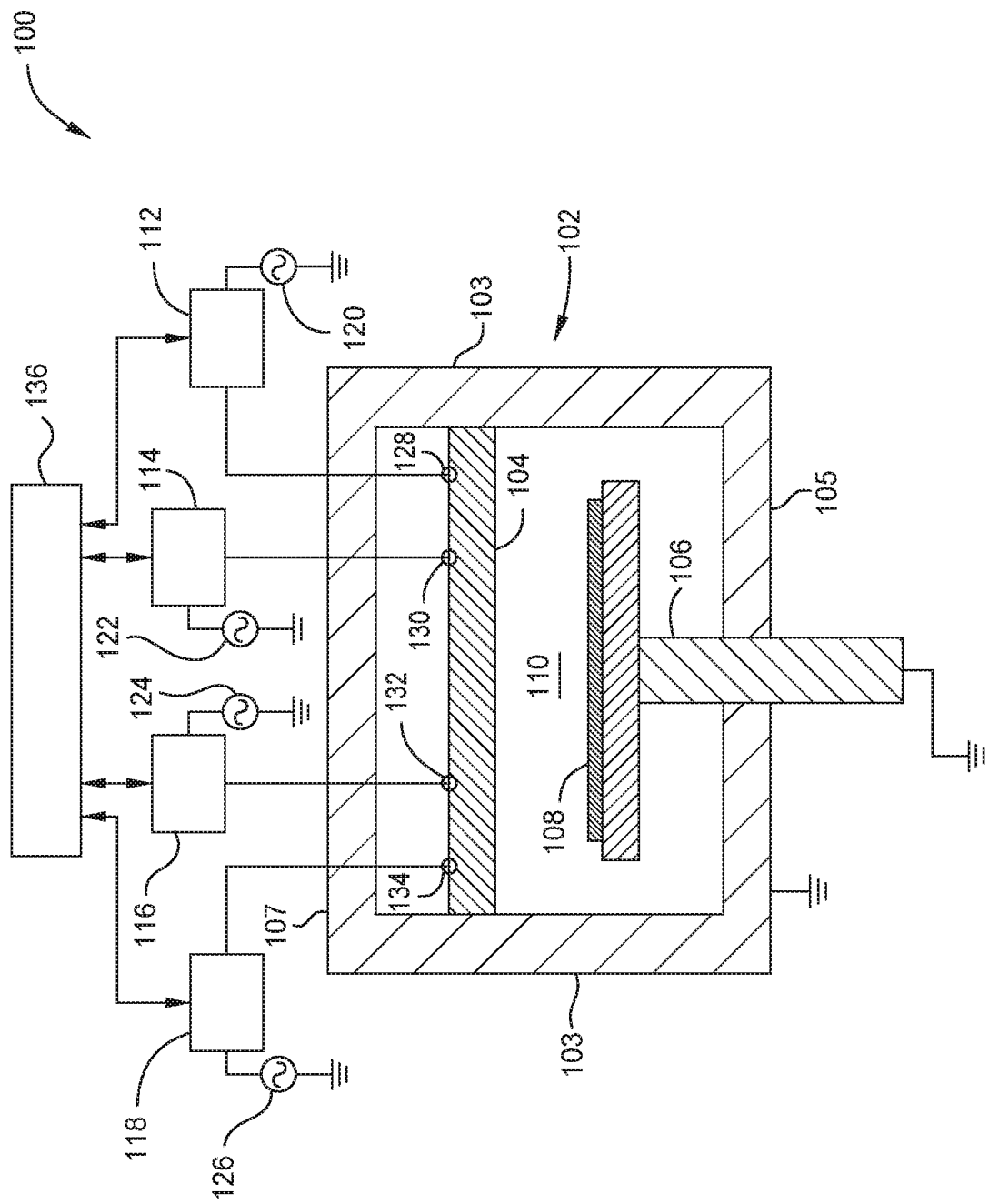
FIG. 1 is a sectional schematic side view of a process system according to at least one embodiment described herein.

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments described herein generally relate to methods of delivering radio frequency (RF) power during a semiconductor process to improve plasma stability and processing results. In these embodiments, multiple matching networks are provided to desirably deliver power to the processing region of a plasma processing chamber. Each of the matching networks couple a radio frequency (RF) source to one of multiple connection points located on an electrode that is electrically coupled to the plasma processing chamber. In some embodiments, the controller is able to utilize match tuning parameter information and physical geometry information of the electrode and/or connection point geometry on the electrode information to adjust the matching parameters of one or more of the matching networks to control the delivery of power to the processing region of a plasma processing chamber. In some embodiments, the tuning parameter information can be voltage/current (V/I) magnitude and phase information used for impendence matching, such as for determining the source power level impedance and the load power level impedance, as described below. Additionally, the received tuning parameter information can be driven frequency information used for frequency matching, also described below. In some embodiments, the physical geometry information can be based on the location of the multiple connection points on the electrode in relation to each other. Based on the received tuning parameter information and physical geometry information, the controller determines a tuning sequence for one or more of the multiple matching networks. As such, some of the matching parameters that are being controlled in one or more of the matching networks are adjusted while the matching parameters that are being controlled in the other matching networks are locked at a fixed point or position. In some embodiments, the matching parameters in one matching network are adjusted while the remaining matching networks are simultaneously locked at a fixed point or position. In other embodiments, the matching parameters in each of a pair of matching networks are tuned while the remaining matching networks are simultaneously locked at a fixed point or position.

Using multiple matching networks leads to a more uniform plasma within the process volume of the process chamber. Improved plasma uniformity leads to less substrate defects and better device performance. Additionally, in these embodiments, the ability to adjust the matching parameters in each of the matching networks in a sequence decreases or prevents electrical interference from affecting the delivery of power by the matching networks. As such, better processing results are achieved in these embodiments compared to conventional approaches in the art.

FIG. 1 is a sectional side view of a process system 100 according to at least one embodiment described herein. The process system 100 includes a substrate 108 supported on a substrate support 106 within a process chamber 102. The process chamber 102 is intended to subject the substrate 108 to a plasma process for fabricating on the substrate 108 electronic devices such as semiconductor devices, display devices (e.g., TFTs), solar cells, or solid state light emitting diodes (LEDs). Examples of a substrate 108 that would be processed within the process chamber 102 include a rectangular glass substrate on which flat panel displays are fabricated or a circular semiconductor substrate on which integrated circuits are fabricated.

The process chamber 102 has electrically conductive sidewalls 103, a bottom wall 105, and a top wall 107, made of a material such as aluminum, that encloses a process volume 110. Typically, all portions of the chamber walls are connected together electrically and are electrically grounded. In performing a plasma process on the substrate 108, one or more process gases are dispensed into the process chamber 102 from a gas source (not shown). The process gases are then dispensed into the process volume 110 through numerous openings in a showerhead, which functions as an electrode 104 in these embodiments.

As shown in FIG. 1, outputs of each of power supplies 120, 122, 124, 126 are connected through respective matching networks 112, 114, 116, 118 to respective connection points 128, 130, 132, 134 on the electrode 104. RF power flows from the outputs of the respective power supplies 120, 122, 124, 126 to the respective connection points 128, 130, 132, 134 on the electrode 104. The RF power is coupled from the electrode 104 to form a plasma within the process volume 110 between the electrode 104 and the substrate support 106. Each of the matching networks 112, 114, 116, 118 may include circuits that include one or more variable capacitors and/or inductors to provide the desired matching to desirably deliver the RF power to the processing region of the processing chamber. Although four power supplies, matching networks, and connection points are shown in FIG. 1, any other number of power supplies, matching networks and connection points can be used, such as, for example, two, three, five, or ten power supplies, matching networks and connection points are used.

In these embodiments, a controller 136 controls the timing of the delivery of RF power from the power supplies 120, 122, 124, 126 as well as the tuning of the matching parameters in the matching networks 112, 114, 116, 118. The controller 136 is used to determine the effectiveness of the ability of the matching networks 112, 114, 116, 118 to deliver RF power to generate and/or maintain a plasma in the processing chamber. During processing, the controller 136 receives tuning parameter information from each matching network 112, 114, 116, 118 and determines a tuning sequence for the matching networks 112, 114, 116, 118 based on the tuning parameter information received and knowledge of the connection point geometry. An example of tuning parameter information is the power that is reflected from the respective matching networks 112, 114, 116, 118 based on measuring the voltage and current. When the reflected power is used as the indicator, a large reflective power is indicative of an unmatched situation. As such, the controller 136 may first produce a tuning signal to one or a pair of the matching networks 112, 114, 116, 118 from which it received the largest reflected power.

While simultaneously tuning one or a pair of the matching networks 112, 114, 116, 118, the controller 136 is configured to lock the remaining matching networks 112, 114, 116, 118. Tuning one or a pair of matching networks 112, 114, 116, 118 at a time advantageously decreases or prevents interference from occurring between the matching networks 112, 114, 116, 118, due to the matching networks 112, 114, 116, 118 being isolated from each other. As such, the controller 136 only processes the tuning parameter information for the desired matching network(s) 112, 114, 116, 118 currently being tuned, and keeps monitoring tuning parameter information from the other networks. Therefore, the controller 136 receives more accurate readings leading to improved results.

In these embodiments, the process system 100 may use impedance tuning as a tuning method to improve plasma stability. For example, each of the matching networks 112, 114, 116, 118 may be tuned by the power supplies 120, 122, 124, 126 producing desired forward power to compensate for the reflected power in order to provide the desired delivered power. A V/I probe/sensor (not shown) in each matching network 112, 114, 116, 118 may detect the load power level impedance ($Z_L$). For example, $Z_L$ (measured from the input side of the each of the matching networks 112, 114, 116, 118) may be adjusted (or tuned) to 50 ohms. As such, further tuning of $Z_L$ is done such that the impedance of $Z_L$ is substantially conjugate to the source power impedance ($Z_S$). Therefore, the matching networks 112, 114, 116, 118 fine tune the impedances of $Z_L$ such that the impedance of $Z_S$ and $Z_L$ are substantially conjugate.

In these embodiments, "substantially" is intended to cover situations where the measured impedances may not be exactly equal, but within a certain threshold range. In some embodiments, the threshold may be a specified or predetermined percentage of the radius of the SWR for $Z_S$ and $Z_L$. The threshold would control the SWR error between $Z_S$ and $Z_L$. That is, if the difference of $Z_L$ (typically equal to 50 ohms) and $Z_S$ is within the threshold range, then tuning would be stopped. If the $Z_L$ SWR does not equal the $Z_S$ SWR within a certain threshold, or the SWR delta for $Z_S$ and $Z_L$ changes above a certain threshold, the RF match would start tuning again until the difference of $Z_S$ and $Z_L$ is within the threshold range. The examples using impedance tuning described above can be used with each of the matching networks 112, 114, 116, 118, and can be applied to each matching network 112, 114, 116, 118 one at a time in a sequence or in a sequence of pairs.

In addition to impedance tuning, the process system 100 may also use frequency tuning as a tuning method to improve plasma stability. For example, a first RF power may be provided to the process chamber 102 by one of the power supplies 120, 122, 124, 126. A first frequency may be associated with the first RF power. In some embodiments, the first frequency may be stored in the controller 136 as the last known tuned frequency at the first RF power. Thereafter, the first frequency may be adjusted by the controller 136 to a second frequency to achieve a new tuned state at the first RF power level, which achieves a desired impedance at the first RF power between one of the power supplies 120, 122, 124, 126 and the $Z_L$. Specifically, the first frequency may be adjusted to the second frequency to reduce a reflected power from one of the power supplies 120, 122, 124, 126 to achieve a new tuned state of one of the matching networks 112, 114, 116, 118. The reflected power is typically reduced to a target of about 0% of forward power provided by one of the power supplies 120, 122, 124, 126 to achieve a tuned state. The examples using frequency tuning described above can be used with each of the matching networks 112, 114, 116, 118, and can be applied to each matching network 112, 114, 116, 118 one at a time in a sequence or in a sequence of pairs.

Figure 2:
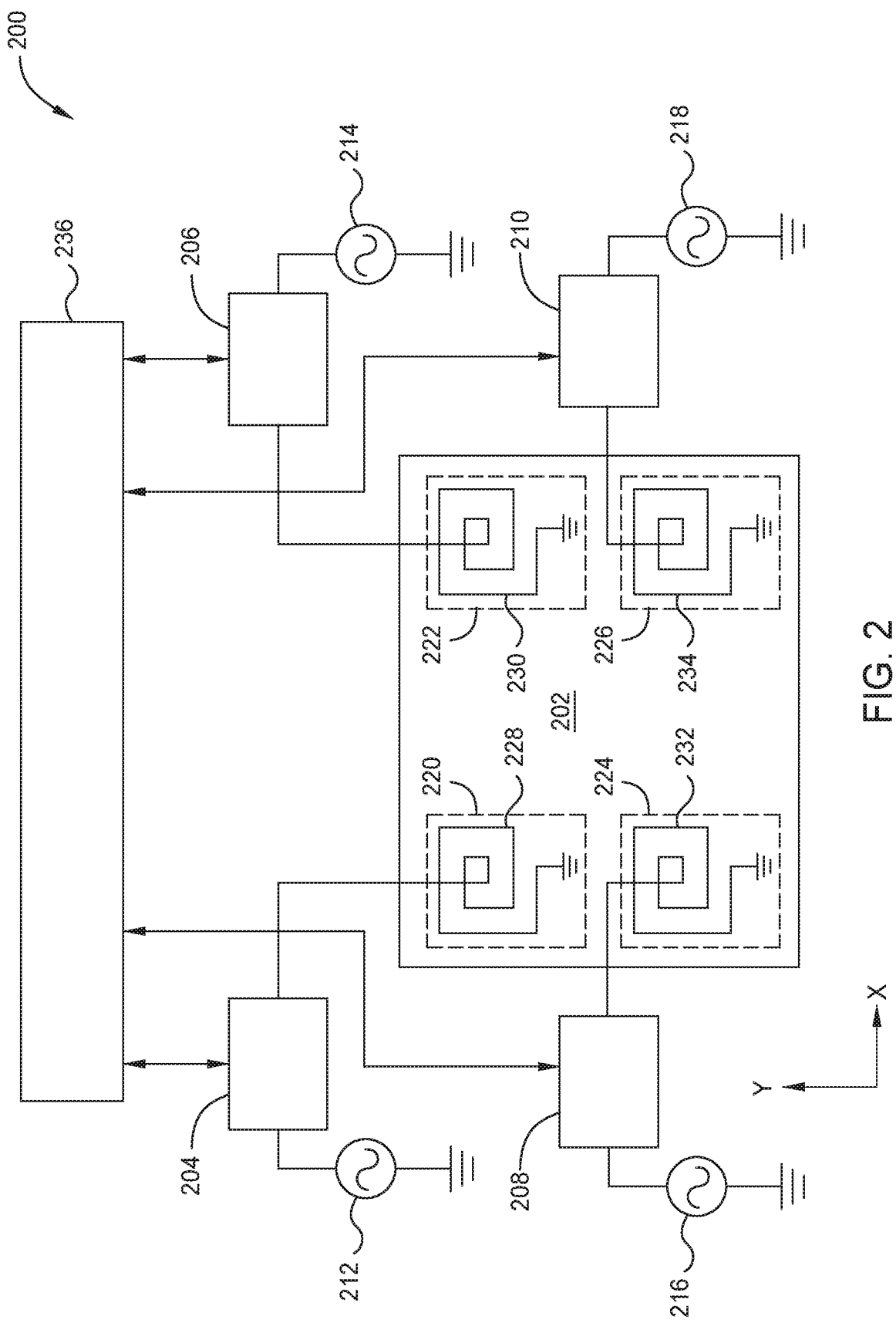
FIG. 2 is a top schematic view of a process system according to at least one embodiment described herein.

FIG. 2 is a schematic view of a process system 200 according to at least one embodiment described herein. As shown in FIG. 2, the respective outputs of each of the power supplies 212, 214, 216, 218 are connected through respective matching networks 204, 206, 208, 210 to respective connection points 220, 222, 224, 226 on a dielectric window 202. In these embodiments, the RF power is inductively coupled to plasma in the process chamber (not shown) located below the dielectric window 202. As such, each connection point 220, 222, 224, 226 includes a respective inductive coil 228, 230, 232, 234. RF power flows from the outputs of the respective power supplies 212, 214, 216, 218 to the respective connection points 220, 222, 224, 226 on the dielectric window 202. Similar to the embodiments described in FIG. 1, each of the matching networks 204, 206, 208, 210 may be circuits that include one or more variable capacitors and/or inductors to provide the desired matching. Although four power supplies, matching networks, and connection points are shown in FIG. 2, any other number of power supplies, matching networks, and connection points can be used.

In these embodiments, similar to the embodiments described in FIG. 1, a controller 236 controls the timing of activating and deactivating the power supplies 212, 214, 216, 218 as well as tuning the matching networks 204, 206, 208, 210. The controller 236 is used to determine the effectiveness of the ability of the matching networks 204, 206, 208, 210 to match the plasma. The controller 236 receives tuning parameter information from each matching network 204, 206, 208, 210 and determines a tuning sequence for the matching networks 204, 206, 208, 210 based on the tuning parameter information received. An example of tuning parameter information is the power that is reflected from the respective matching networks 204, 206, 208, 210 based on measuring the voltage and current and its phase angle. When the reflected power is used as the indicator, a large reflective power is indicative of an unmatched situation. As such, the controller 236 may first produce a tuning signal to one or a pair of the matching networks 204, 206, 208, 210 from which it received the largest reflected power. While simultaneously tuning one or a pair of the matching networks 204, 206, 208, 210, the controller 236 is configured to lock the remaining matching networks 204, 206, 208, 210. Tuning one or a pair of matching networks 204, 206, 208, 210 at a time advantageously decreases or prevents interference from occurring between the matching networks 204, 206, 208, 210.

Figure 3:
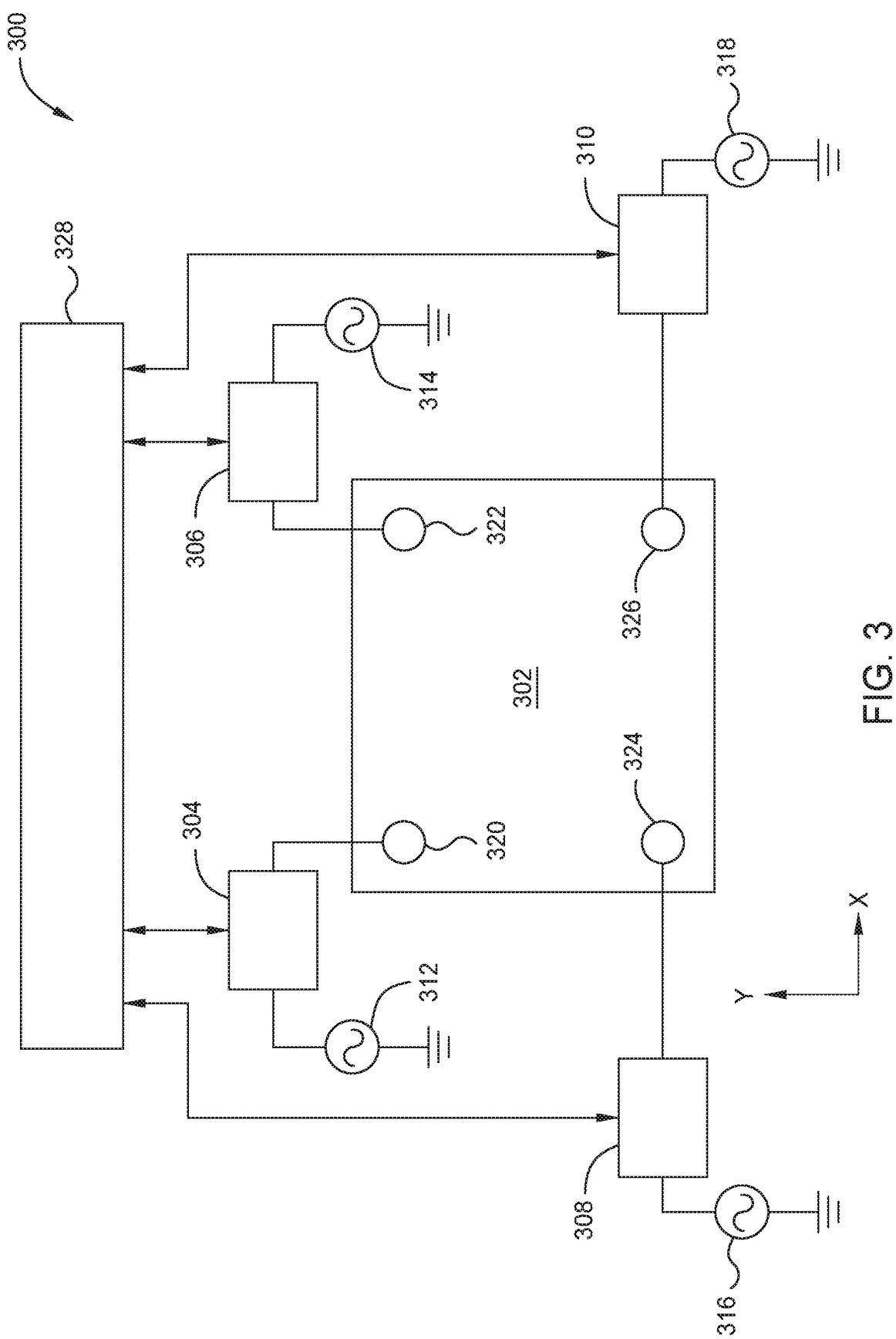
FIG. 3 is a top schematic view of a process system according to at least one embodiment described herein.

FIG. 3 is a schematic view of a process system 300 according to at least one embodiment described herein. As shown in FIG. 3, the respective outputs of each of the power supplies 312, 314, 316, 318 are connected through respective matching networks 304, 306, 308, 310 to respective connection points 320, 322, 324, 326 on an electrode 302. In these embodiments, the RF power is capacitively coupled to plasma in the process chamber (not shown) located below the electrode 302. RF power flows from the outputs of the respective power supplies 312, 314, 316, 318 to the respective connection points 320, 322, 324, 326 on the electrode 302. Similar to the embodiments described in FIGS. 1-2, each of the matching networks 304, 306, 308, 310 may be circuits that include one or more variable capacitors and/or inductors to provide the desired matching. Although four power supplies, matching networks, and connection points are shown in FIG. 3, any other number of power supplies, matching networks, and connection points can be used.

In these embodiments, similar to the embodiments described in FIGS. 1-2, a controller 328 controls the timing of activating and deactivating the power supplies 312, 314, 316, 318, as well as tuning the matching networks 304, 306, 308, 310. The controller 328 is used to determine the effectiveness of the ability of the matching networks 304, 306, 308, 310 to match the plasma. The controller 328 receives tuning parameter information from each matching network 304, 306, 308, 310 and determines a tuning sequence for the matching networks 304, 306, 308, 310 based on the tuning parameter information received. An example of tuning parameter information is the power that is reflected from the respective matching networks 304, 306, 308, 310 based on the voltage and current and its phase angle. When the reflected power is used as the indicator, a large reflective power is indicative of an unmatched situation. As such, the controller 328 may first produce a tuning signal to one or a pair the matching networks 304, 306, 308, 310 from which it received the largest reflected power. While simultaneously tuning one or a pair of the matching networks 304, 306, 308, 310, the controller 328 is configured to lock the remaining matching networks 304, 306, 308, 310. Tuning one or a pair of matching networks 304, 306, 308, 310 at a time advantageously decreases or prevents interference from occurring between the matching networks 304, 306, 308, 310.

Figure 4:
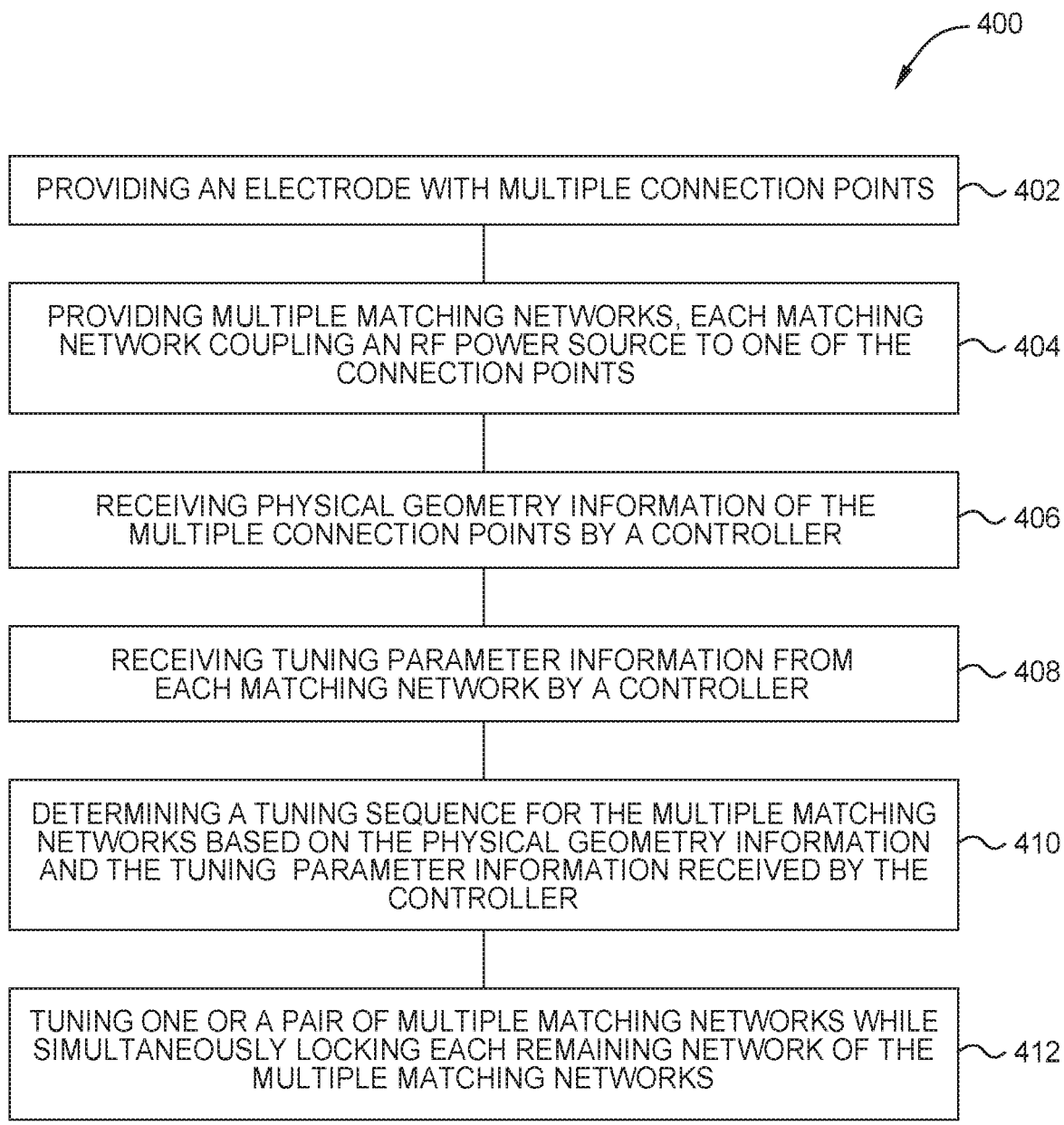
FIG. 4 is a flow chart of a method according to at least one embodiment described herein.

FIG. 4 is a flow chart of a method 400 according to at least one embodiment described herein. In these embodiments, the method 400 is performed with the systems and devices described in FIGS. 1-3, but is not limited to these systems and devices and can be performed with other similar systems and devices.

In block 402, an electrode is provided with multiple connection points. The electrode can be the electrode 104, 202, or 302 described above in FIGS. 1-3. The multiple connection points can be the connection points 128, 130, 132, 134 described in FIG. 1, the connection points 220, 222, 224, 226 described in FIG. 2, or the connection points 320, 322, 324, 326 described in FIG. 3.

In block 404, multiple matching networks are provided. The matching networks can be the matching networks 112, 114, 116, 118 described in FIG. 1, the matching networks 204, 206, 208, 210 described in FIG. 2, or the matching networks 304, 306, 308, 310 described in FIG. 3. In these embodiments, each matching network couples an RF power supply to one of the connection points. The RF power supplies can be the power supplies 120, 122, 124, 126 described in FIG. 1, the power supplies 212, 214, 216, 218 described in FIG. 2, or the power supplies 312, 314, 316, 318 described in FIG. 3.

In block 406, physical geometry information of the multiple connection points is received by a controller. The controller can be the controller 136, 236, or 328 described above in FIGS. 1-3. The physical geometry information received by the controller can be related to the positioning of each of the connection points in relation to each other. For example, information related to the spacing between each one of the connection points can be received by the controller.

In block 408, tuning parameter information from each of the matching networks is received by the controller. In these embodiments, the received tuning parameter information can be V/I information used for impendence matching, such as V/I information to determine the $Z_S$ and the $Z_L$ described above. Additionally, the received tuning parameter information can be frequency information used for frequency matching described above.

In block 410, a tuning sequence for the multiple matching networks is determined based on the physical geometry information and/or the tuning parameter information received by the controller. In some embodiments, based on the physical geometry information received by the controller, the controller can determine which matching network or matching networks to match first. For example, the controller can determine that a pair of matching networks with connection points located furthest apart from each other be tuned together first. Tuning matching networks spaced further apart advantageously decreases or prevents interference from occurring between the matching networks. As such, a pair of matching networks located diagonal from each other on the electrode can be tuned together first, such as matching networks 204 and 210 with connection points 220 and 226 and matching networks 206 and 208 with connection points 222 and 224 shown in FIG. 2, or matching networks 304 and 310 with connection points 320 and 326 and matching networks 306 and 308 with connection points 322 and 324 shown in FIG. 3.

In another example, a pair of matching networks separated from each other in in the X direction can be tuned together first, such as matching networks 204 and 206 with connection points 220 and 222 and matching networks 208 and 210 with connection points 224 and 226 shown in FIG. 2, or matching networks 304 and 306 with connection points 320 and 322 and matching networks 308 and 310 with connection points 324 and 326 shown in FIG. 3.

In another example, a pair of matching networks separated from each other in in the Y direction can be tuned together first, such as matching networks 204 and 208 with connection points 220 and 224 and matching networks 206 and 210 with connection points 222 and 226 shown in FIG. 2, or matching networks 304 and 308 with connection points 320 and 324 and matching networks 306 and 310 with connection points 322 and 326 shown in FIG. 3. After tuning the first pair of matching networks, the next pair of matching networks can then be tuned until all of the matching networks are tuned.

In some embodiments, based on the tuning parameter information received by the controller, the controller can determine which matching network or matching networks to match first. For example, tuning parameter information such as the difference between the $Z_S$ and the $Z_L$ can be used to determine which matching network or matching networks to match first. Additionally, tuning parameter information such as the difference in frequencies can be used to determine which matching network or matching networks to match first. For example, the matching network 204, 206, 208, 210 shown in FIG. 2 or the matching network 304, 306, 308, 310 shown in FIG. 3 having the greatest difference in impedances can be tuned first. After tuning the first matching network, the next matching network having the greatest difference in impendences can be tuned next. This process can be repeated until all of the matching networks are matched. In other embodiments, both the tuning parameter information and the physical geometry information received by the controller can determine the tuning sequence of the matching networks.

In block 412, one matching network or a pair of matching networks are tuned while the remaining matching networks are simultaneously locked. As such, each matching network or pair of matching networks are tuned without interference from the other matching networks. As discussed above, the ability to tune each of the matching networks in a sequence decreases or prevents interference from occurring between the matching networks, leading to improved plasma uniformity that results in fewer substrate defects and better device performance.

Figure 5:
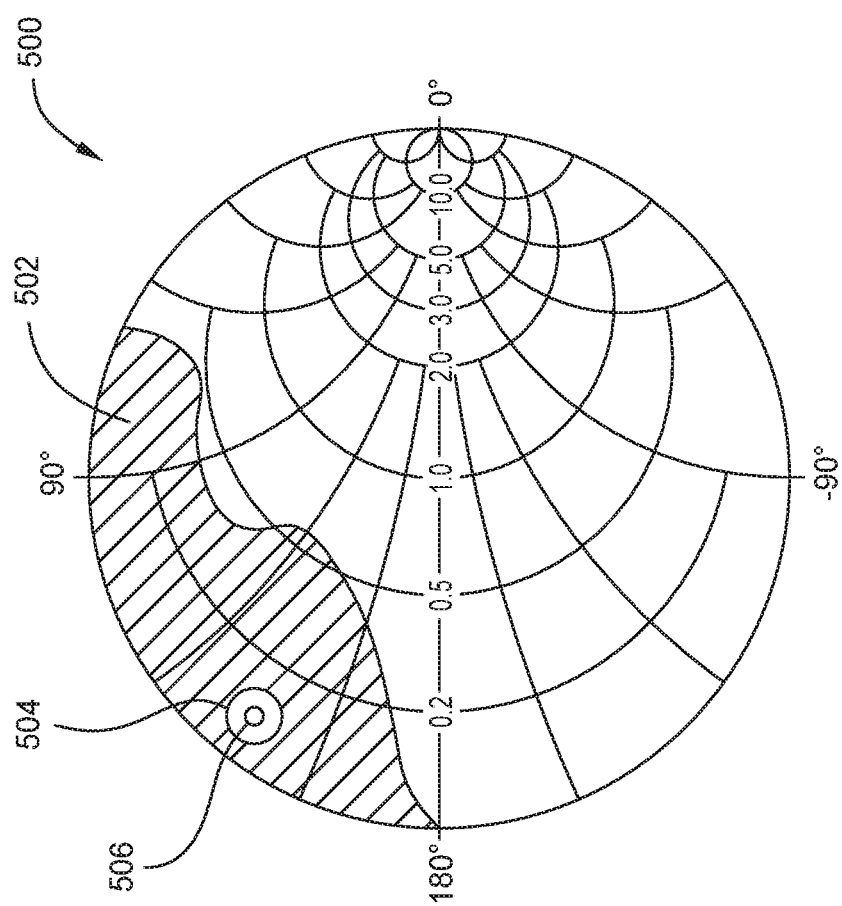
FIG. 5 is a smith chart illustration according to at least one embodiment described herein.

FIG. 5 is a smith chart 500 according to at least one embodiment described herein. The smith chart 500 illustrates a conventional tuning range 502 that results from conventional approaches and methods in the art. In comparison, the smith chart 500 illustrates an impedance 506 and a narrowed tuning range 504 that results from embodiments described in the method 400 herein. The narrowed tuning range 504 represents less reflected power which shows improved impedance matching in comparison with the conventional tuning range 502 representing greater reflected power which shows poor impendence matching. As such, better results are achieved in these embodiments compared to conventional approaches and methods in the art.

While the foregoing is directed to embodiments of the present disclosure, other and further embodiments of the disclosure may be devised without departing from the basic scope thereof, and the scope thereof is determined by the claims that follow.

We claim:

1. A method of tuning during a plasma process providing processing gas through a showerhead, the method comprising:
   receiving, by a controller, tuning parameter information from each matching network of multiple matching networks, wherein each matching network of the multiple matching networks couples a radio frequency (RF) power source to one of multiple connection points of an electrode;
   determining a tuning sequence for the multiple matching networks based on the tuning parameter information received by the controller; and
   tuning one of the multiple matching networks while simultaneously locking each remaining matching networks of the multiple matching networks.

2. The method of claim 1, wherein the tuning parameter information comprises voltage information, current information, and phase angle information used for impendence tuning.

3. The method of claim 1, wherein the tuning parameter information comprises frequency information used for frequency tuning.

4. The method of claim 1, wherein the multiple connection points comprise four connection points and the multiple matching networks comprise four matching networks.

5. The method of claim 1, wherein the electrode is the showerhead.

6. A method of tuning during a plasma process providing processing gas through a showerhead, the method comprising:
   receiving, by a controller, physical geometry information from multiple matching networks, wherein each matching network of the multiple matching networks couples a radio frequency (RF) power source to one of multiple connection points of an electrode;
   determining a tuning sequence for the multiple matching networks based on the physical geometry information received by the controller; and
   tuning a pair of the multiple matching networks together while simultaneously locking each remaining matching networks of the multiple matching networks.

7. The method of claim 6, wherein the physical geometry information comprises information related to a positioning of each of the multiple connection points in relation to each other.

8. The method of claim 7, wherein the multiple connection points comprise four connection points and the multiple matching networks comprise four matching networks.

9. The method of claim 8, wherein a pair of the four matching networks with a pair of connection points spaced diagonally from each other is tuned first.

10. The method of claim 8, wherein a pair of the four matching networks with a pair of connection points spaced in the X direction from each other is tuned first.

11. The method of claim 8, wherein a pair of the four matching networks with a pair of connection points spaced in the Y direction from each other is tuned first.

12. A method of tuning during a plasma process providing processing gas through a showerhead, the method comprising:
   receiving, by a controller, tuning parameter information and physical geometry information from each matching network of multiple matching networks, wherein each matching network of the multiple matching networks couples a radio frequency (RF) power source to one of multiple connection points of an electrode;
   determining a tuning sequence for the multiple matching networks based on the physical geometry information and the tuning parameter information received by the controller; and
   tuning a pair of the multiple matching networks together while simultaneously locking each remaining matching networks of the multiple matching networks.

13. The method of claim 12, wherein the tuning parameter information comprises voltage information, current information, and phase angle information used for impendence tuning.

14. The method of claim 12, wherein the tuning parameter information comprises frequency information used for frequency tuning.

15. The method of claim 12, wherein the physical geometry information comprises information related to a positioning of each of the multiple connection points in relation to each other.

16. The method of claim 1, wherein the multiple connection points comprise four connection points.

17. The method of claim 1, the multiple matching networks comprise four matching networks.

18. The method of claim 6, wherein the multiple connection points comprise four connection points.

19. The method of claim 6, the multiple matching networks comprise four matching networks.

20. The method of claim 12, wherein the multiple connection points comprise four connection points and the multiple matching networks comprise four matching networks.

* * * * *